United States Patent
Mohindra

(10) Patent No.: US 6,314,279 B1
(45) Date of Patent: Nov. 6, 2001

(54) FREQUENCY OFFSET IMAGE REJECTION

(75) Inventor: Rishi Mohindra, Milpitas, CA (US)

(73) Assignee: Philips Electronics North America Corporation, New York, NY (US)

( * ) Notice: Subject to any disclaimer, the term of this patent is extended or adjusted under 35 U.S.C. 154(b) by 0 days.

(21) Appl. No.: 09/107,186

(22) Filed: Jun. 29, 1998

(51) Int. Cl.[7] ............................... H04B 1/10; H03H 7/20
(52) U.S. Cl. ..................... 455/304; 333/139; 455/317
(58) Field of Search .................................. 455/302–305, 455/323, 324, 326, 325; 329/302, 308, 323; 333/138, 139, 140, 32, 156

(56) References Cited

U.S. PATENT DOCUMENTS

| | | | |
|---|---|---|---|
| 2,964,622 | * 10/1957 | Fire | 455/302 |
| 3,575,660 | * 4/1971 | Jorgensen | 455/302 |
| 4,488,119 | * 12/1984 | Marshall | 329/323 |
| 4,755,761 | * 7/1988 | Ray, Jr. | 329/323 |
| 5,140,198 | * 8/1992 | Atherly et al. | 327/113 |
| 5,398,080 | * 3/1995 | Sakashita et al. | 348/735 |
| 5,410,743 | * 4/1995 | Seely et al. | 455/326 |
| 5,559,457 | * 9/1996 | Uda et al. | 327/116 |
| 5,678,220 | 10/1997 | Fournier | 455/302 |
| 5,826,180 | * 10/1998 | Golan | 455/302 |
| 5,901,349 | * 5/1999 | Guengnaud et al. | 455/302 |
| 5,912,975 | * 6/1999 | Schott | 381/1 |
| 5,922,964 | * 7/1999 | Ishikawa et al. | 73/661 |

FOREIGN PATENT DOCUMENTS

| | | | |
|---|---|---|---|
| 2192039 | 6/1997 | (CA) | H04B/1/26 |
| 4126080A1 | 4/1992 | (DE) | H03D/7/26 |
| 0715403A1 | 6/1996 | (EP) | H03D/7/16 |
| 0489749B1 | 9/1996 | (EP) | H03D/7/18 |
| 0779704A1 | 6/1997 | (EP) | H03D/7/18 |

* cited by examiner

*Primary Examiner*—Nguyen Vo
*Assistant Examiner*—Charles N. Appiah
(74) *Attorney, Agent, or Firm*—Brian J. Wieghaus

(57) ABSTRACT

An approach for providing image rejection during signal down conversion involves phase shifting quadrature signals at a frequency other than the down converted center frequency. One or more phase shifters coupled to a summer/subtractor provide forty five (45) degrees and one hundred thirty five (135) degrees of phase shift with respect to two quadrature input signals. The one or more phase shifters perform the phase shifts of the quadrature input signals at a frequency other than the center frequency of the down-converted signal.

15 Claims, 7 Drawing Sheets

FREQUENCY OFFSET IMAGE REJECTION

FIELD OF THE INVENTION

The invention relates to signal processing, and more specifically, to image rejection in signal down converters.

BACKGROUND OF THE INVENTION

Communication system receivers often employ image rejection to remove undesired information from received signals. The term "image rejection" is well known in the art to refer to the removal of certain undesirable information, such as a particular frequency band. In the context of wireless telephony, an example of undesired information is a conversation carried on another channel.

Image rejection in receivers has traditionally been provided by passive filters. More recently, image rejection is being implemented in receiver down converters to ease the rejection requirements of preceding passive filters. As is well known in the art, receiver down converters process a received signal and generate a down-converted signal having a lower frequency. A conventional receiver down converter is described with reference to FIGS. 1, 2A and 2B.

FIG. 1 is a block diagram illustrating a conventional image reject down converter arrangement 100. A received signal $s(t)_1$ is processed by a passive filter 102 that removes undesirable information from signal $s(t)_1$ and provides a filtered signal $s(t)_1'$. One example of a passive filter that is typically used for passive filter 102 is a surface acoustic wave (SAW) filter. Filtered signal $s(t)_1'$ is provided to an automatic gain controller (AGC) 106 that adjusts the gain of signal $s(t)'$ to provide an output signal $s(t)_1''$. The gain of signal $s(t)_1''$ provided by AGC 106 is selected to be compatible with, i.e. not saturate, a band-pass (BP) filter 122 that is described in more detail hereinafter.

Signal $s(t)_1''$ is provided to an image reject mixer 107. Within image reject mixer 107, signal $s(t)_1''$ is provided to a mixer 108 along with a signal $s_{LO}$ generated by a local oscillator 110 and having a frequency of $f_{LO}$. Mixer 108 generates a signal $V_I'$. Signal $s_{LO}$ is also provided to a phase shifter 112 that generates a phase shifted signal $s_{LO}'$ that is ninety (90) degrees out of phase with respect to signal $s_{LO}$. Multiple phase shifters are sometimes employed to provide the signals $s_{LO}$ and $s_{LO}'$ so long as the total phase shift between signals $s_{LO}$ and $s_{LO}'$ is ninety (90) degrees. For example, two phase shifters providing phase shifts of plus forty five (+45) degrees and minus forty five (−45) degrees may be employed.

A mixer 114 combines signal $s(t)_1''$ with phase shifted signal $s_{LO}'$ and generates a signal $V_Q'$. Signal $V_I'$ is ninety (90) degrees out of phase with respect to signal $V_Q'$. Signal $V_I'$ is processed by a phase shifter 116 that generates a signal $V_I$ that is forty five (45) degrees out of phase with respect to signal $V_I'$. A phase shifter 118 processes signal $V_Q'$ and provides a signal $V_Q$ that is one hundred thirty-five (135) degrees out of phase with respect to signal $V_Q'$. Thus, phase shifters 116 and 118 provide an additional ninety (90) degrees of phase shift of the unwanted image information contained in signals $V_I$ and $V_Q$.

Signals $V_I$ and $V_Q$ are provided to a summer/subtractor 120 that selects either an upper or lower side band to be removed. Summer/subtractor 120 provides a down-mixed signal $V_{IF}$ having a center frequency of $f_{IF}$. Signal $V_{IF}$ is processed by BP filter 122 centered at frequency $f_{IF}$ that provides a filtered signal $V_{IF}'$ to a conventional demodulator 124.

FIG. 2A contains a chart 200 illustrating the spectrum of the conventional image reject down converter 100 of FIG. 1 for a down-converted signal having a relatively high center frequency ($f_{IF}$). The gain of passive filter 102 is represented by line 202. Thus, the desired information in the form of a lower side band 204, centered around the receiver frequency $f_{RF}$, is not removed by passive filter 102, since line 202 has a high cut-off at the lower $f_3$ and upper $f_4$ edges of lower side band 204. However, the unwanted image in the form of an upper side band 206, centered around an image frequency $f_{IM}$, is removed by passive filter 102, which has minimal gain (maximum attenuation) at the lower $f_1$ and upper $f_2$ edges of sideband 206. The difference between the image frequency ($f_{IM}$) and the local oscillator frequency ($f_{LO}$) is the same as the difference in frequency between the local oscillator frequency ($f_{LO}$) and the reference frequency ($f_{RF}$). Summer/subtractor 120 is used to select either upper side band 206 or lower side band 204 to be removed from the received signal as follows:

$$V_{IF} = V_I + V_Q$$

(removes upper side band)

$$V_{IF} = V_I - V_Q$$

(removes lower side band)

A recent trend has been to implement communication system receivers as integrated devices, sometimes referred to as "on chip" receivers, to reduce their size and manufacturing costs. One approach for implementing receivers on integrated devices is to reduce the center frequency of the down-converted signal so that the demodulators can be integrated at a much smaller current. However, there are several drawbacks with using conventional down converter arrangement 100 for down-converted signals having lower center frequencies. Specifically, as the center frequency of down-converted signals is decreased, the upper and lower side bands 206 and 204 are closer to the local oscillator frequency ($f_{LO}$). As the upper and lower side bands 206 and 204 move closer to the local oscillator frequency ($f_{LO}$), the image rejection near the image frequencies to be removed can become insufficient to remove the entire image band due to roll-off in passive filter 102.

FIG. 2B contains a chart 210 that illustrates the spectrum of image reject down converter 100 for a down-converted signal having a relatively low center frequency ($f_{IF}$), of about 4 times the signal bandwidth. As illustrated by chart 210, upper side band 206 is not filtered in the same manner as in FIG. 2(a). The upper side band is no longer sufficiently removed by passive filter 102 since upper side band 206 is situated in the roll-off region of filter 102. Particularly, the upper edge $f_2$ and lower edge $f_1$ side band 206 are not equally filtered by passive filter 102 for down-converted signals having relatively low center frequencies ($f_{IF}$). Thus, the upper side band 206 is not completely cut off as in FIG. 2(a), and the partial attenuation which does occur is asymmetric, with the amplitude of the lower edge $f_1$ and upper edges $f_2$ being different.

FIG. 3 is a chart 300 illustrating image rejection provided by image reject mixer 107 (indicated by line 302), passive filter 102 (indicated by line 304), BP filter 122 (indicated by line 305), and the total image rejection of image reject mixer 107, passive filter 102, and BP filter 122 (indicated by line 306). The attenuation provided by image reject mixer 107 (line 302) is centered at $F_{IF}$, the location of which is represented by point 308. FIG. 3 does not necessarily completely and accurately illustrate the image rejection of image reject down converter 100 and filter 102, and is provided to convey the limitations and asymmetric image rejection characteristics of image reject down converter 100 and filter 102.
Where:

$f_{RF}$ is the receiver signal frequency, $f_{IM}$ is the image frequency band to be removed, $f_{IF}$ is the center frequency of the down-mixed signal, $f_1$ is the lower edge of image band, and $f_2$ is the upper edge of image band then $$f_{LO}=f_{RF}+f_{IF};$$

and $$f_{IM}=f_{LO}+f_{IF}=f_{RF}+2*f_{IF}.$$

As is illustrated by chart 300, image rejection at $f_1$ is different (asymmetric) from the image rejection at $f_2$. In addition, the worst case image rejection is often unacceptable for certain applications. For example, the worst case image rejection is typically less than seventy (70) decibels (dB) at $f_1$1, which is unsuitable for many communication systems, such as wireless telephony. Therefore, the conventional approach for providing image rejection in signal down converters does not provide adequate image rejection for down-converted signals having relatively low center frequencies ($f_{IF}$).

Accordingly, based upon the need for image rejection receiver down converters and the limitations in prior approaches, an approach for performing image rejection in receiver down converters that produces symmetric image rejection at the upper and lower image band edges while providing a worst case image rejection level suitable for wireless communication applications is highly desirable.

SUMMARY OF THE INVENTION

This and other needs are met by embodiments of the invention, which provide an image reject down converter comprising: one or more phase shifters responsive to first and second input signals for generating first and second phase-shifted signals, wherein the first input signal is about ninety (90) degrees out of phase with respect to the second input signal and wherein the undesired image information contained in the first phase-shifted signal is about one hundred eighty (180) degrees out of phase with respect to the undesired image information contained in the second phase-shifted signal A summer/subtractor is coupled to the one or more phase shifters and is responsive to the first and second phase-shifted signals for generating a down-converted signal that represents either a sum of the first and second phase-shifted signals or a difference of the first and second phase-shifted signals. The generation of the first and second phase-shifted signals by the one or more phase shifters involves a phase shift of the first and second input signals at a frequency other than a center frequency of the down-converted signal.

The earlier stated needs are also met by another aspect of the present invention, which provides a method for rejecting an image from a received signal. The method comprises the steps of receiving first and second input signals, the first input signal being about ninety (90) degrees out of phase with respect to the second input signal. First and second phase-shifted signals are generated based upon the first and second input signals, the undesired image information contained in the first phase-shifted signal being about one hundred eighty (180) degrees out of phase with respect to the undesired image information contained in the second phase-shifted signal. A down-converted signal is generated based upon the first and second phase-shifted signals, the down-converted signal representing either a sum of the first and second phase-shifted signals or a difference of the first and second phase-shifted signals. The generation of the first and second phase-shifted signals involves performing a phase shift of the first and second input signals at a frequency other than a center frequency of the down-converted signal.

Embodiments of the invention described herein provide several advantages over prior approaches for providing image rejection during signal down conversion. The embodiments provide relatively equal image rejection at both the upper and lower edges of the frequency band for down-converted signals having relatively low center frequencies. The frequency at which the additional ninety (90) degree phase shift provided by the phase shifters described hereinafter can be adjusted or "tuned" for a specific receiver to provide the favorable image rejection as described herein. The use of down-converted signals having relatively low center frequencies allows the integration of the demodulators at a much lower current consumption or power consumption. In addition, the embodiments described herein provide a worst case rejection of better than 70 dB which is suitable for many communication applications, such as wireless telephony.

Other aspects and features of the invention will become apparent from the following description and claims.

BRIEF DESCRIPTION OF THE DRAWINGS

Embodiments of the invention are illustrated by way of example, and not by way of limitation, in the figures of the accompanying drawings and in which like reference numerals refer to similar elements and in which.

DETAILED DESCRIPTION OF THE PREFERRED EMBODIMENT

In the following description, for the purposes of explanation, specific details are set forth in order to provide a thorough understanding of the invention. However, it will be apparent that the invention may be practiced without these specific details. In other instances, well-known structures and devices are depicted in block diagram form in order to avoid unnecessarily obscuring the invention.

The present invention provides image rejection during signal down conversion that involves phase shifting quadrature signals at a frequency other than the down converted center frequency. This approach provides asymmetric image rejection over the image band to equalize role-off and attenuation of preceding passive filters, thereby providing equal image rejection at both the upper and lower edges of the image band while improving upon the worst case rejection in the image band.

Figure 1:
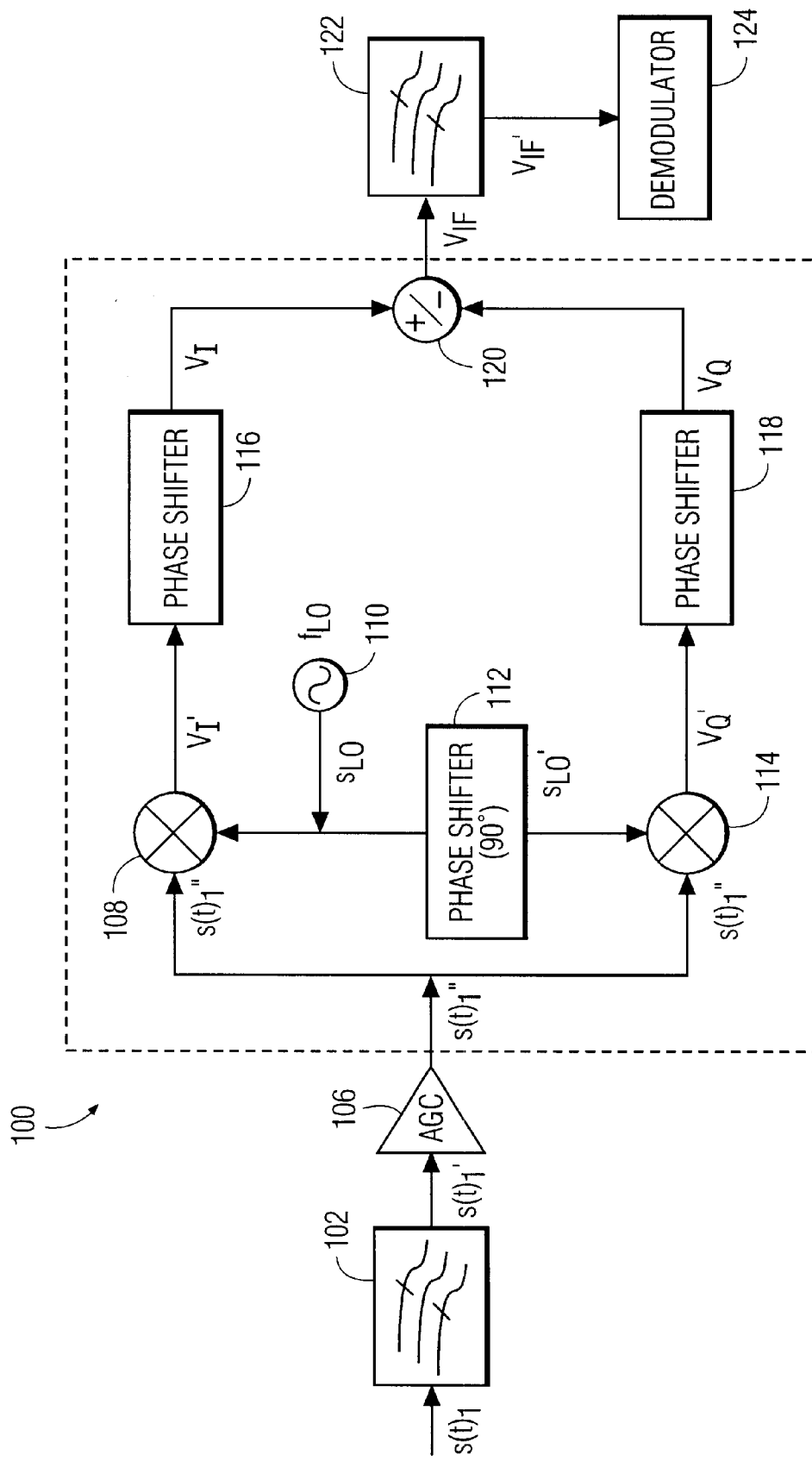
FIG. 1 is a block diagram illustrating a conventional image reject filter and image reject down converter mixer arrangement.
Figure 2A:
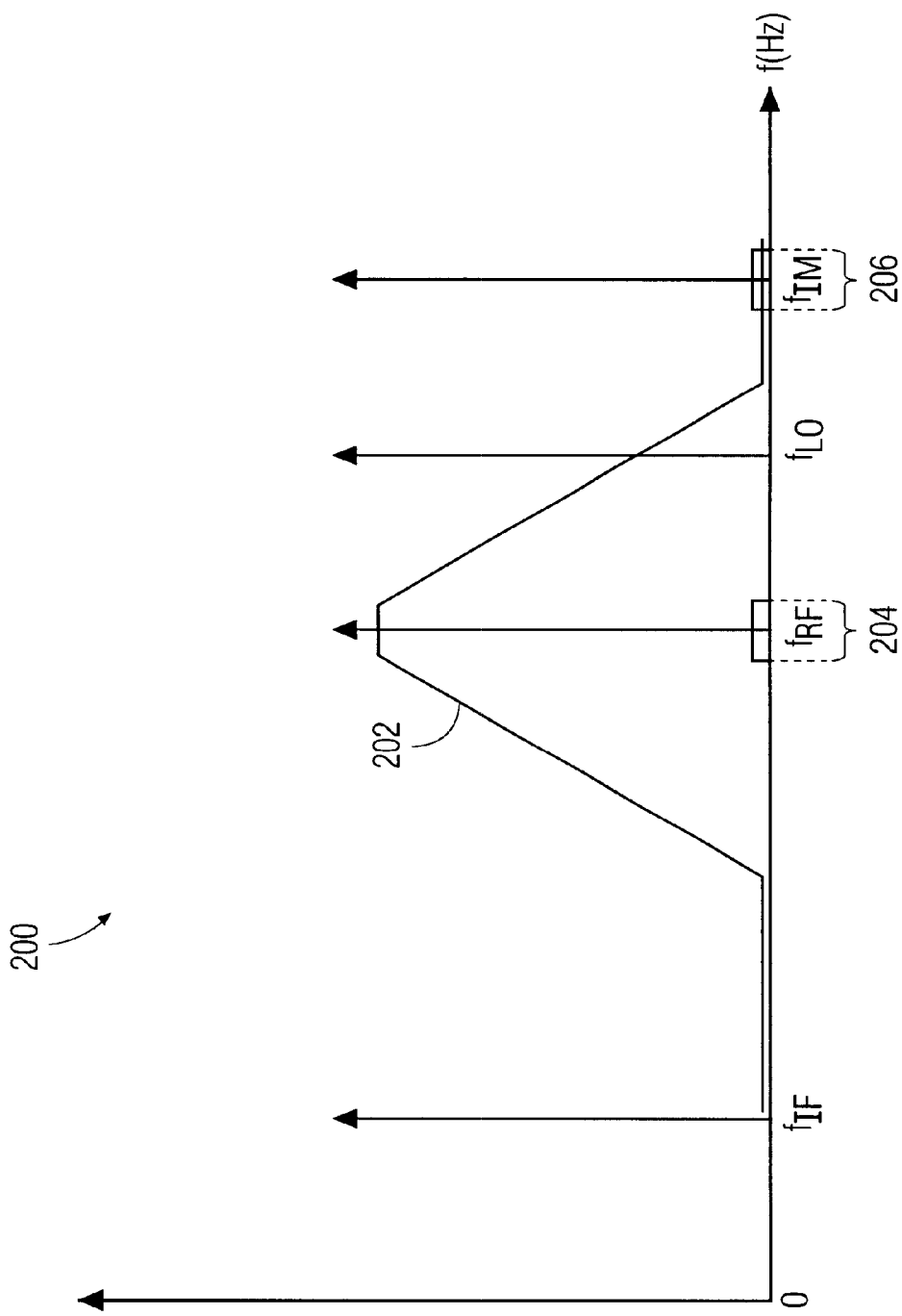
FIG. 2A is a chart illustrating the image rejection characteristics of the image reject down converter mixer and filter arrangement of FIG. 1 for down-converted signals having a relatively high center frequencies.
Figure 2B:
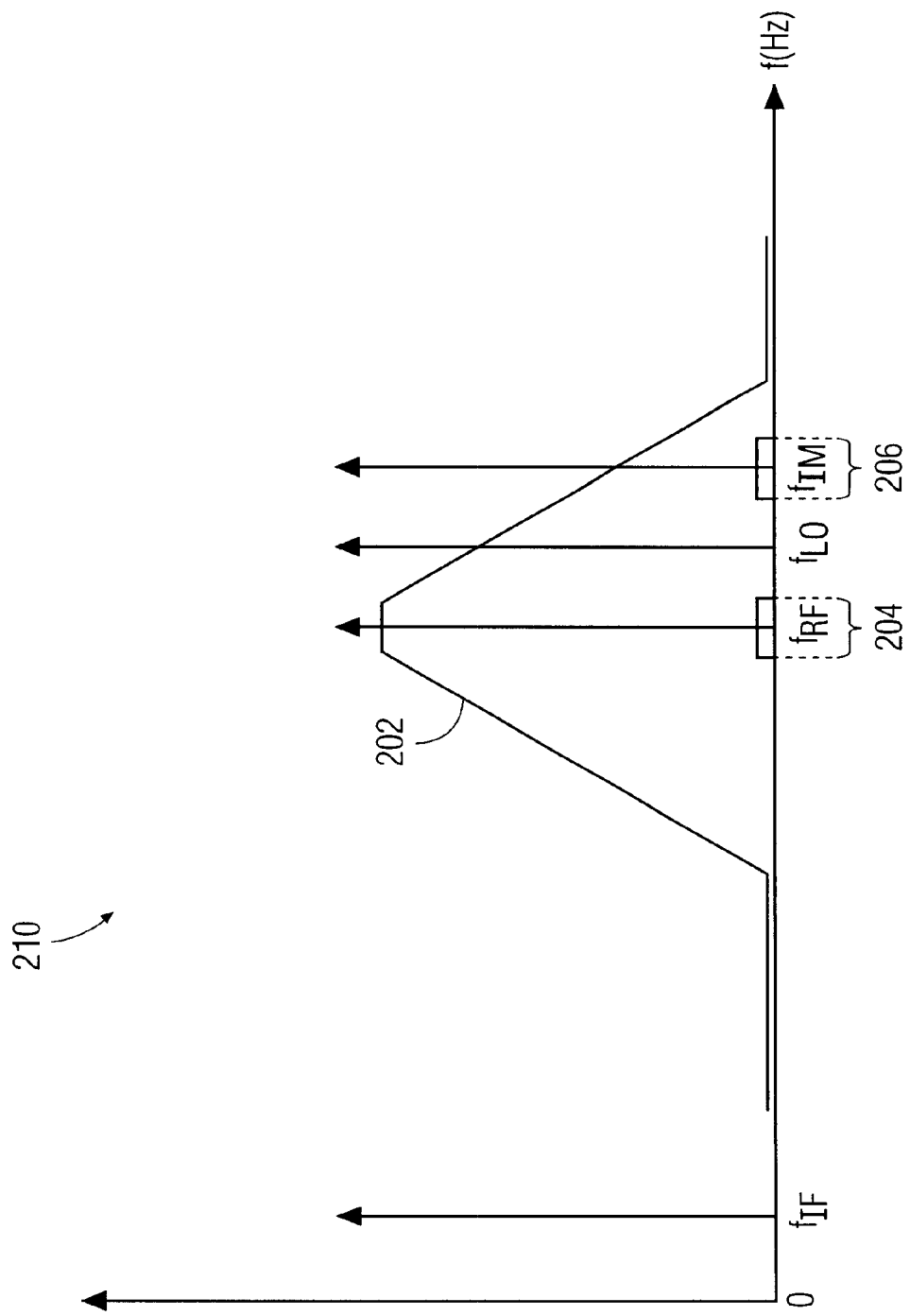
FIG. 2B is a chart illustrating the image rejection characteristics of the image reject down converter mixer arrangement of FIG. 1 for down-converted signals having relatively low center frequencies.
Figure 3:
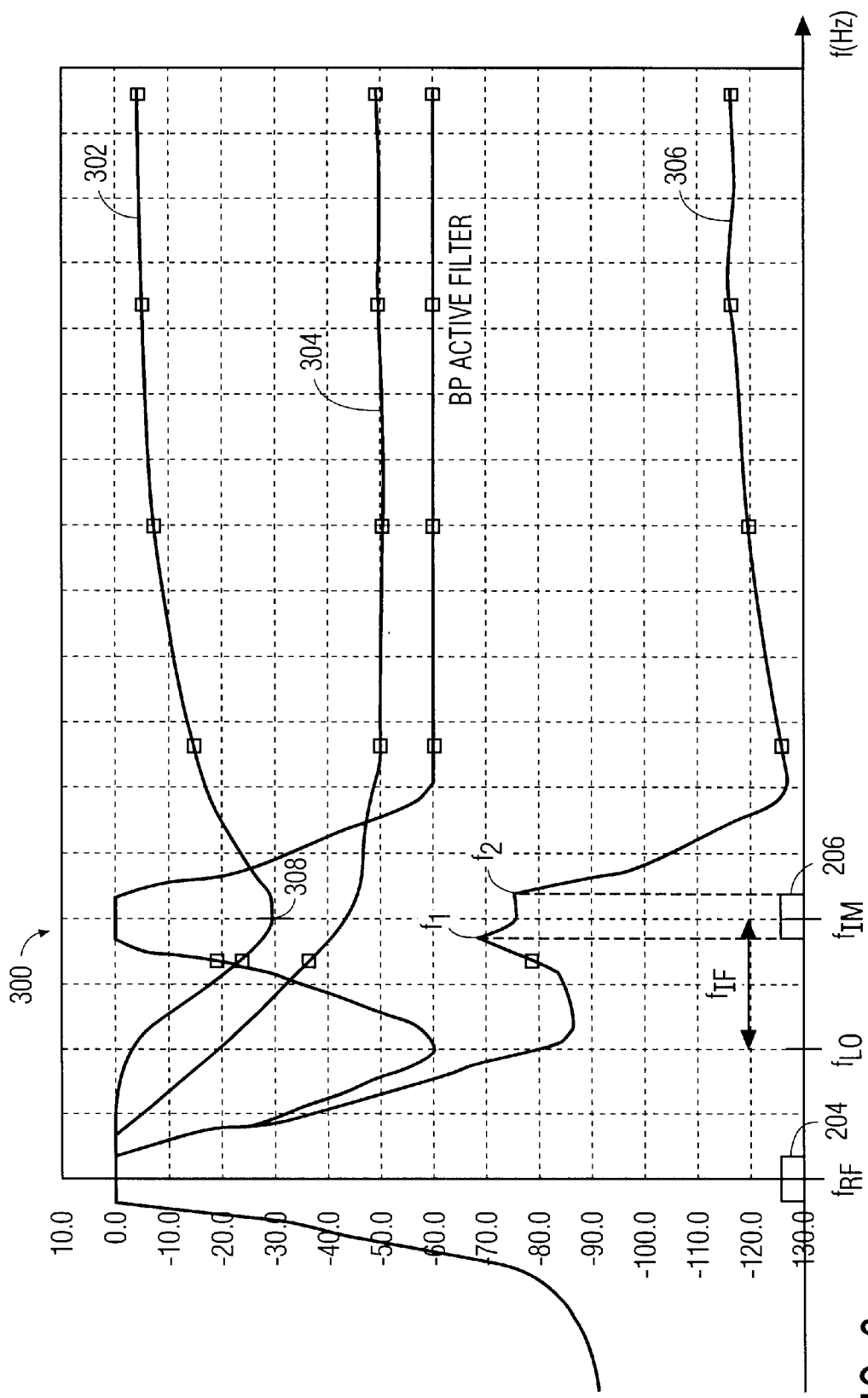
FIG. 3 is a graph illustrating the frequency response of the image rejection filter and image rejection down converter of FIG. 1.
Figure 4:
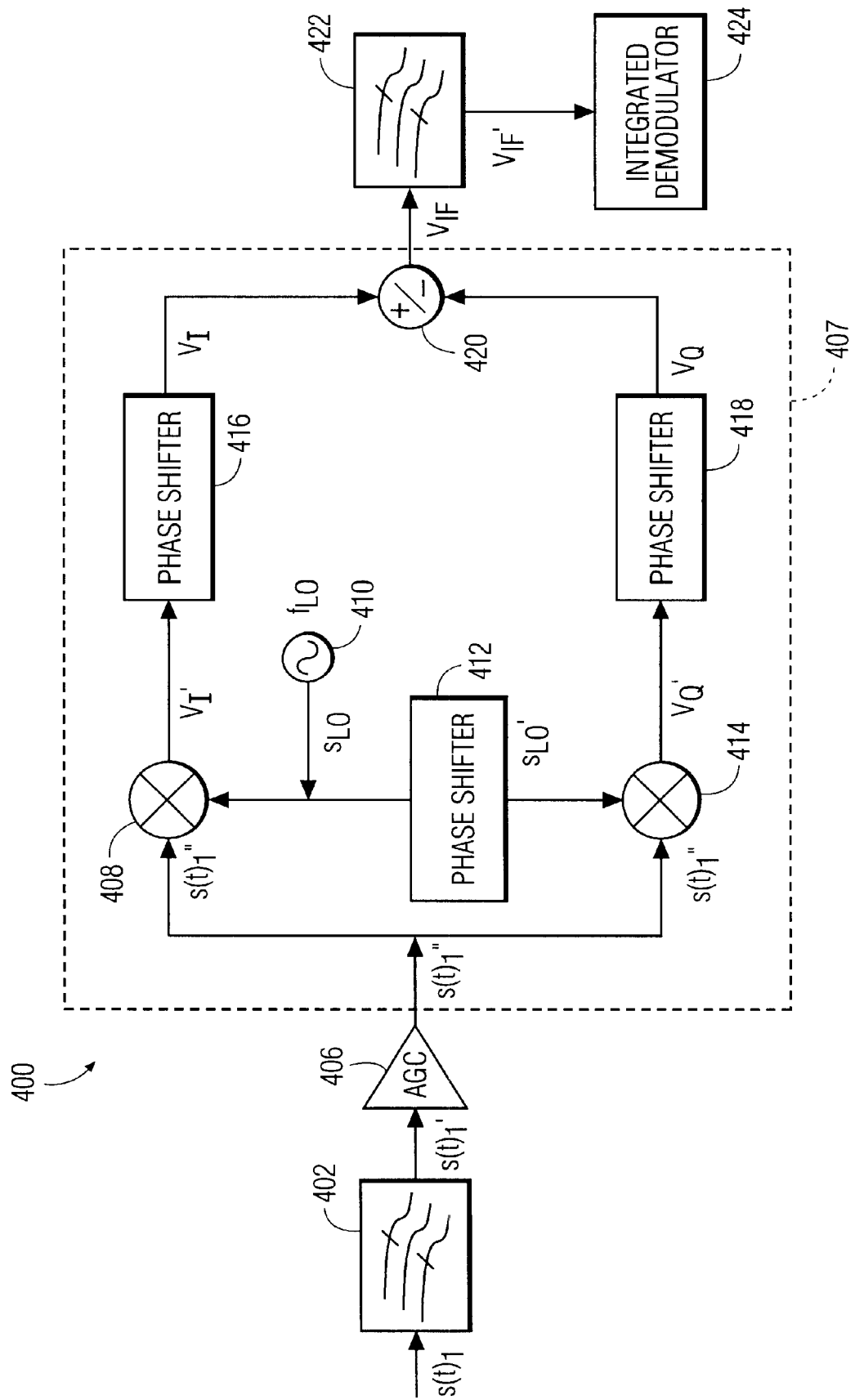
FIG. 4 is a block diagram illustrating an image reject down converter arrangement according to an embodiment of the invention.

FIG. 4 is a block diagram illustrating an image reject down converter arrangement 400 according to an embodiment of the invention. A received signal $s(t)_1$ is processed by a passive filter 402 that removes undesirable information from signal $s(t)_1$ and provides a filtered signal $s(t)_1'$. One example of a passive filter that is typically used for passive filter 402 is a surface acoustic wave (SAW) filter. The gain of filtered signal $s(t)_1'$ is adjusted by an automatic gain controller (AGC) 406 that adjusts the gain of signal $s(t)_1'$ to provide an output signal $s(t)_1''$. The gain of signal $s(t)_1''$ provided by AGC 406 is selected to be compatible with, i.e. not saturate, a band-pass (BP) filter 422.

Signal $s(t)_1''$ is provided to an image reject mixer in accordance with an embodiment of the invention. Specifically, signal $s(t)_1''$ is provided to a mixer 408 along with a signal $s_{LO}$ generated by a local oscillator 410 and having a frequency of $f_{LO}$. Mixer 408 generates a signal $V_I'$. Signal $s_{LO}$ is also provided to a phase shifter 412 that generates a phase shifted signal $s_{LO}'$ that is ninety (90) degrees out of phase with respect to signal $s_{LO}$. Multiple phase shifters may be employed in place of phase shifter 412 to provide the signals $s_{LO}$ and $s_{LO}'$ so long as the total phase shift between signals $s_{LO}$ and $s_{LO}'$ is ninety (90) degrees.

A mixer 414 combines signal $s(t)_1''$ with phase shifted signal $s_{LO}'$ and generates a signal $V_Q'$. Signal $V_I'$ is ninety (90) degrees out of phase with respect to signal $V_Q'$. Signal $V_I'$ is processed by a phase shifter 416 that generates a signal $V_I$ that is forty five (45) degrees out of phase with respect to signal $V_I'$. A phase shifter 418 processes signal $V_Q'$ and provides a signal $V_Q$ that is one hundred thirty-five (135) degrees out of phase with respect to signal $V_Q'$. Thus, phase shifters 416 and 418 provide an additional ninety (90) degrees of phase shift of the unwanted image information contained in signals $V_I$ and $V_Q$.

Signals $V_I$ and $V_Q$ are provided to a summer/subtractor 420 that selects either upper side band 206 or lower side band 204 to be removed to generate the down-converted signal. Summer/subtractor 420 provides a down-mixed signal $V_{IF}$ having a center frequency of $f_{IF}$. Signal $V_{IF}$ is processed by BP filter 422 centered at frequency $f_{IF}$ that provides a filtered signal $V_{IF}'$ to an integrated demodulator 424.

Figure 5:
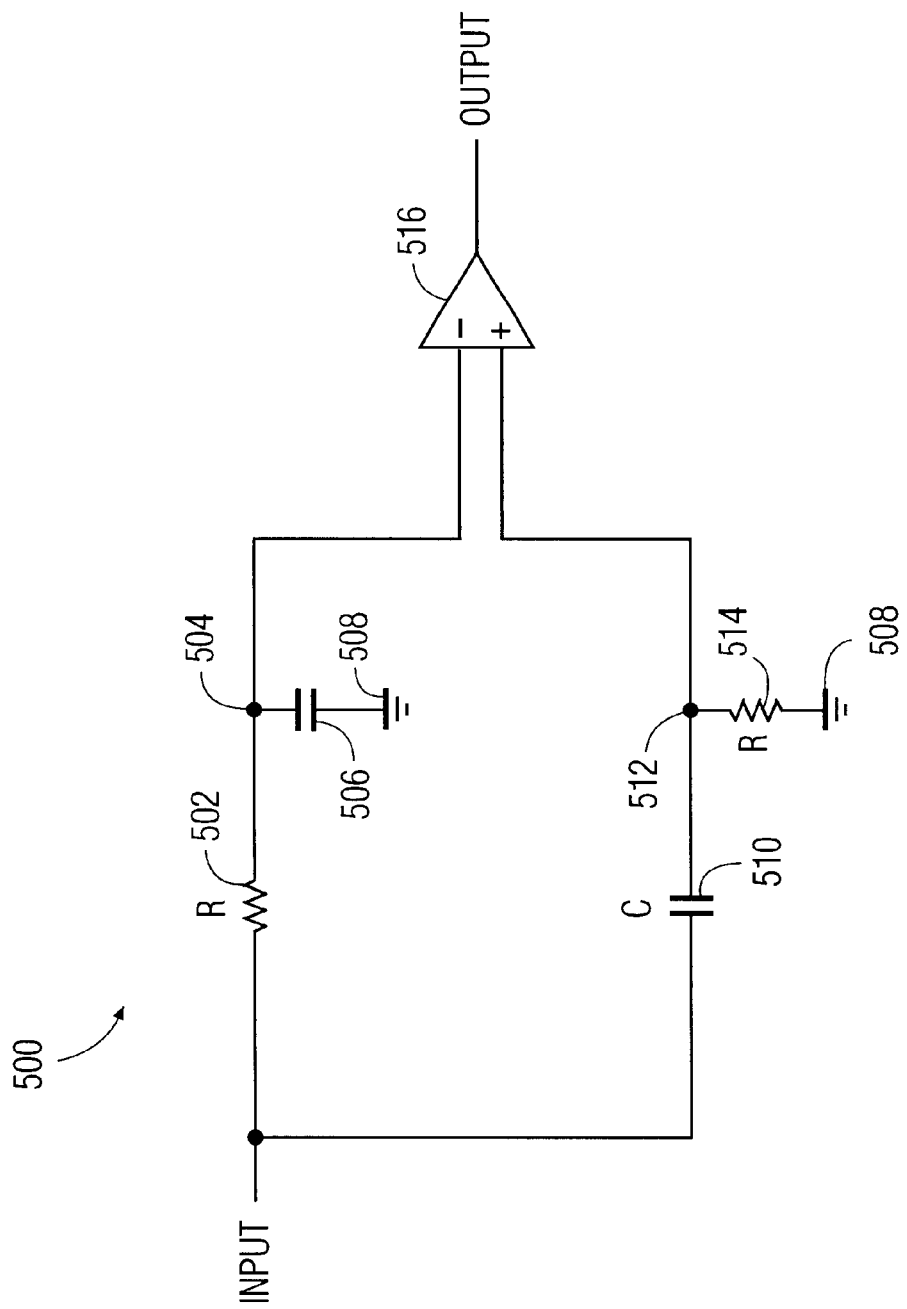
FIG. 5 is a block diagram schematically illustrating a circuit implementation of a phase shifter used in the image reject down converter arrangement of FIG. 4 according to an embodiment of the invention.

FIG. 5 is a block diagram of a circuit implementation 500 for phase shifters 416 and 418 according to an embodiment of the invention. When used in phase shifters 416 and 418 circuit implementation 500 provide a phase shift of ninety (90) degrees between signals $V_I'$ and $V_Q'$ at a frequency other than the center frequency of the down-converted signal. This provides asymmetric image rejection of the upper and lower edges of the image band to compensate for role-off in the attenuation of a proceeding passive filter. In addition, the worst case rejection is significantly improved.

Circuit 500 is an all-pass network that includes a resistor 502 connected between an INPUT and a node 504. A capacitor 506 is connected between node 504 and a ground 508. Another capacitor 510 is connected between INPUT and a node 512. A resistor 514 is connected between node 512 and the ground 508. All-pass network 500 also includes a buffer 516 that is preferably a unity gain buffer, having a non-inverting (+) input and an inverting (−) input. The non-inverting (+) input of buffer 516 is connected to node 512. The inverting (−) input of buffer 516 is connected to node 504. The output of buffer 516 is connected to the OUTPUT of all-pass network 500.

The specific component values for resistors 502, 514 and capacitors 506, 510 are selected based upon the particular frequency at which the ninety (90) degree phase shift between signals $V_I'$ and $V_Q'$ is to be provided. According to prior approaches, the component values for safe phase shifters are selected to provide a phase shift around the center frequency of the down-converted signal. However, embodiments of the invention as described herein include selecting the components for phase shifters 416 and 418 so that the additional ninety (90) degrees of phase shift between signals $V_I'$ and $V_Q'$ provided by phase shifters 416 and 418 is performed around a frequency other than the center frequency of the down-converted signal. According to an embodiment of the invention, the frequency at which the phase shift is to be centered is defined as follows:

$$f_{IF}'=f_{IF}-\Delta_F$$

where:

$f_{IF}'$ is the frequency at which the phase shift is to be centered, $f_{IF}$ is the center frequency of the down-converted signal, and $\Delta_F$ is the frequency offset by which the phase shift is to be shifted from the center frequency of the down-converted signal. The value for $\Delta_F$ varies with the receiver frequency bandwidth and image frequency bandwidth and may be positive or negative depending upon whether an upper or lower side band is to be removed from the received signal.

The values for resistors 502 and 514 and capacitors 506 and 510 for phase shifter 418 are determined by the following equation:

$$C = \frac{2.4142}{2\pi * R * f_{IF}'} \qquad (1)$$

The values for resistors 502 and 514 and capacitors 506 and 510 for phase shifter 416 are determined by the following equation:

$$C = \frac{1}{2.4142 * 2\pi * R * f_{IF}'} \qquad (2)$$

Where "R" is the value of resistors 502 and 514, and "C" is the value of capacitors 506 and 510.

For example, where:

$f_{RF}$=85 MHz, and $f_{IF}$=60 KHz, a $\Delta_F$ of about 8 KHz has been found to be suitable. Thus for a $f_{IF}'$ of 52 KHz the component values for phase shifters 416 and 418 are as follows:

| phase shifter 416 (45° phase shift) | phase shifter 418 (135° phase shift) |
|---|---|
| resistors 502 and 514: 100K ohms | resistors 502 and 514: 100K ohms |
| capacitors 506 and 510: 12.7 pF | capacitors 506 and 510: 73.9 pF |

Figure 6:
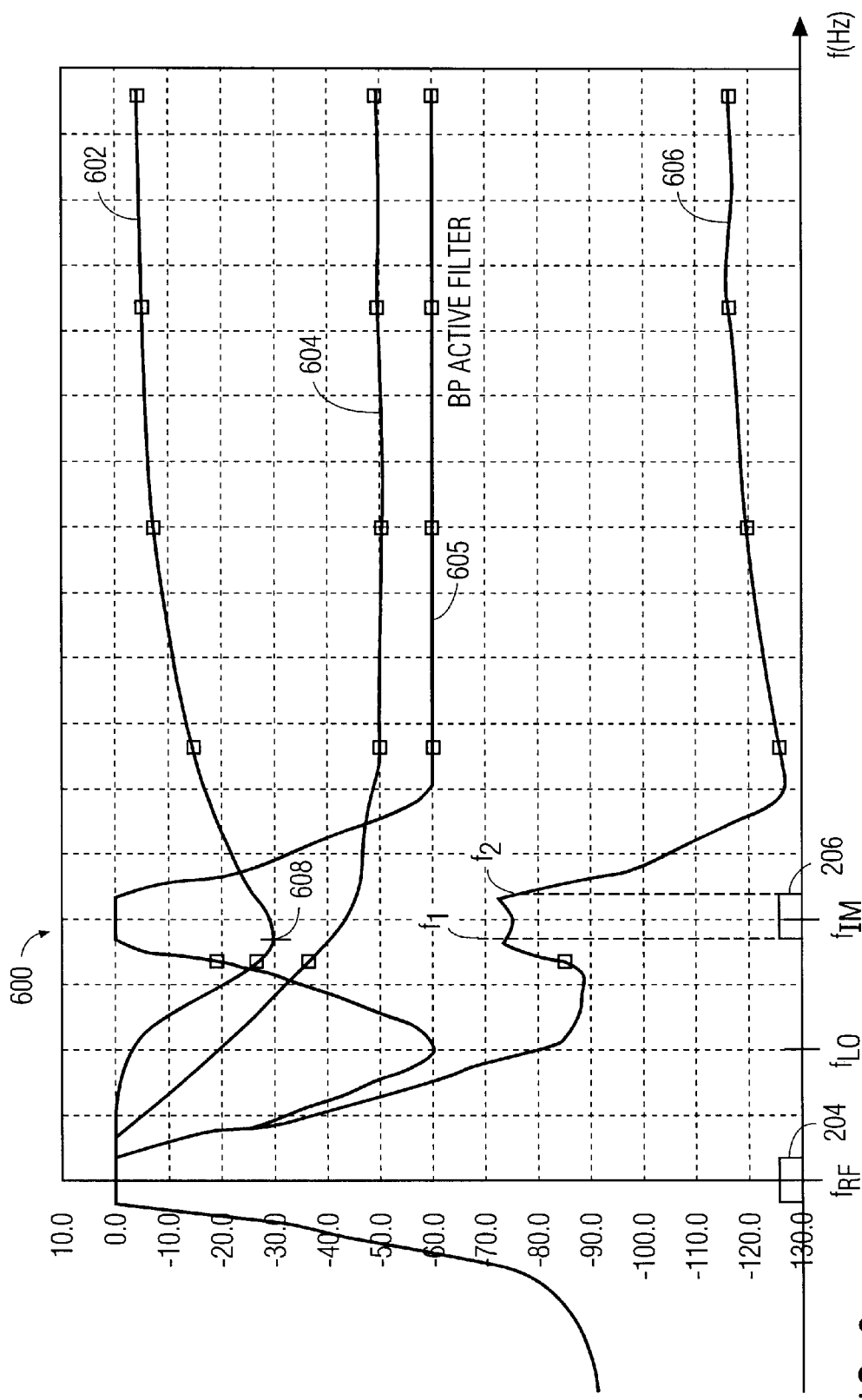
FIG. 6 is a graph illustrating the frequency response of the image rejection down converter of FIG. 4 according to an embodiment of the invention.

FIG. 6 is a chart 600 illustrating the image rejection provided by image reject mixer 407 (indicated by line 602), passive filter 402 (indicated by line 604), BP filter 422 (indicated by line 605), and the total of image reject mixer 407, passive filter 402, and BP filter 122 (indicated by line 606). The attenuation provided by image reject mixer 407 (line 602) is centered at $f_{IF}-\Delta_F$, the location of which on line 602 is represented by point 608. FIG. 6 does not necessarily completely and accurately illustrate the image rejection of image reject down converter 400 and is provided to convey the superior symmetric image rejection characteristics of image reject down converter 400 relative to conventional image reject down converters.

Where:

$f_{RF}$ is the receiver signal frequency, $f_{IM}$ is the image frequency band to be removed, $f_{IF}$ is the center frequency of the down-mixed signal, $f_1$ is the lower edge of the image band, and $f_2$ is the upper edge of the image band, then $$f_{LO}=f_{RF}+f_{IF};$$

and $$f_{IM}=f_{LO}+f_{IF}=f_{RF}+2*f_{IF}.$$

As is illustrated by chart 600, the image rejection at the image frequency $f_1$ is similar (symmetric) to the image rejection at $f_2$. In addition, the worst case image rejection is improved to better than 70 dB, which is suitable for most telecommunication applications, such as wireless telephony applications. These significant performance improvements are provided by phase shifting the received signal at a frequency other than the down-converted signal to compensate for the inability of passive filter 402 to remove the image equally over the image band when the center frequency of the down-converted signal is relatively low. Thus, the combination of the filtering provided by passive filter 402 and the image rejection provided by phase shifting the received signal at a frequency other than the center frequency of the down-converted signal provides the symmetric image rejection and worst case image rejection levels as described herein.

Although embodiments of the invention have been described in the context of image reject down converter arrangement 400, passive filter 402 and AGC 406 are not required for applications where a filtered and gain-adjusted signal is provided to mixers 408 and 414. Moreover, mixers 408 and 414, local oscillator 410 and phase shifter 412, which together comprise the first phase shifter module, are not required for applications where quadrature signals $V_I$ and $V_Q$, having a ninety (90) degree phase shift with respect to each other, are provided to phase shifters 416 and 418.

The approach described herein for providing image rejection during signal down conversion provides several advantages over prior approaches for providing image rejection during signal down conversion. The approach provides relatively equal image rejection at both the upper and lower edges of the frequency band for down-converted signals having relatively low center frequencies. The frequency ($f_{IF}$) at which the additional ninety (90) degree phase shift provided by phase shifters 416 and 418 can be adjusted or "tuned" for a specific receiver to provide the favorable image rejection as described herein. The use of down-converted signals having relatively low center frequencies allows the integration of the demodulator at a much lower current. In addition, the approach provides a worst case rejection of better than 70 dB which is suitable for many communication applications such as wireless telephony. For example, embodiments of the invention are applicable to any frequency range, but are particularly well suited for communication systems operating in the eight hundred to about nine hundred (800–900) MHz frequency range.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A phase shifter for providing a phase shift between a phase shifter input and a phase shifter output, the phase shifter comprising:

a first resistor connected between the phase shifter input and a first node;

a first capacitor connected between the first node and a ground;

a second capacitor connected between the phase shifter input and a second node;

a second resistor connected between the second node and a ground; and a difference amplifier having a first input, a second input, and an output that corresponds to a difference between the first and second input, the second input connected to the second node, the first input connected to the first node and the output connected to the phase shifter output.

2. The phase shifter as recited in claim 1, wherein values for the first and the second capacitors are determined by the following equation:

$$C = \frac{2.4142}{2\pi * R * f_{IF}'}$$

where "R" represents a value of the first and second resistors and $f_{IF}'$ is the frequency at which the first and second input signals are phase shifted.

3. The phase shifter as recited in claim 1, wherein values for the first and the second capacitors are determined by the following equation:

$$C = \frac{1}{2.4142 * 2\pi * R * f_{IF}'}$$

where "R" represents a value of the first and second resistors and $f_{IF}'$ is the frequency at which the first and second input signals are phase shifted.

4. An image reject down converter which receives a filtered signal $(s(t)_1'')$ from a filter, the filter receiving a signal $(s(t)_1')$ and having a roll-off frequency region in which the attenuation of the signal $(s(t)_1')$ varies with frequency, said down converter comprising:

an input phase shifter module which receives the filtered signal $(s(t)_1'')$ and outputs a first intermediate signal (Vi') and a second intermediate signal (Vq'), the second intermediate signal (Vq') being 90 degrees out of phase with the first intermediate signal (Vi');

first and second phase shifters coupled to the phase shifter module, the first phase shifter phase shifting the first intermediate signal (Vi') to provide a first phase shifted signal (Vi) and the second phase shifter phase shifting the second intermediate signal (Vq') to provide a second phase shifted signal (Vq), the second phase shifted signal (Vq) being phase shifted 180 degrees relative to the first phase shifted signal (Vi); and a device coupled to the first and second phase shifters and responsive to the first and second phase shifted signals (Vi, Vq) to generate a down converted signal ($V_{IF}$) equal to at least one of (i) the sum and (ii) the difference of the first (Vi) and second (Vq) phase shifted signals, the down converted signal ($V_{IF}$) having a center frequency and an image band ($f_{IM}$), the image band being shifted from the center frequency and situated in the roll-off frequency region of the filter such that the filtered signal in the image band has asymmetric attenuation, wherein the first and second phase shifters phase shift the first and second intermediate signals at a center frequency shifted from the center frequency of the down converted signal so that the attenuation of the filtered signal ($s(t)_1"$) in the image band by the down converter is asymmetric and substantially opposite the image rejection of the signal ($s(t)_1'$) by the filter such that the attenuation of the image band ($f_{IM}$) in the down converted signal ($V_{IF}$) is at least substantially symmetric and greater than the attenuation of the signal ($s(t)_1'$) by the filter.

5. The image reject down converter as recited in claim 4, wherein the first phase-shifted signal is about forty five (45) degrees out of phase with respect to the first intermediate signal and the second phase-shifted signal is about one hundred thirty five (135) degrees out of phase with respect to the second intermediate signal.

6. The image reject down converter as recited in claim 4, wherein each of the first and second phase shifters includes a phase shifter input and a phase shifter output and comprises:

a first resistor connected between the phase shifter input and a first node, a first capacitor connected between the first node and a ground, a second capacitor connected between the phase shifter input and a second node, a second resistor connected between the second node and the ground, and a buffer having a non-inverting input connected to the second node, an inverting input connected to the first node and an output connected to the phase shifter output.

7. The image reject down converter as recited in claim 6, wherein values for the first and the second capacitors are determined by the following equation:

$$C = \frac{2.4142}{2\pi * R * f_{IF'}}$$

where "R" represents a value of the first and second resistors and $f_{IF}$ is the frequency at which the first and second intermediate signals are phase shifted.

8. The image reject down converter as recited in claim 6, wherein values for the first and the second capacitors are determined by the following equation:

$$C = \frac{1}{2.4142 * 2\pi * R * f_{IF'}}$$

where "R" represents a value of the first and second resistors and $f_{IF'}$ is the frequency at which the first and second input signals are phase shifted.

9. An image reject down converter according to claim 4, wherein said input phase shifter module comprises:

first and second mixers each having a first signal input which receives the filtered input signal and a second input;

a local oscillator and an input phase shifter which together provide respective signals to the second inputs of the first and second mixers to generate the first and second intermediate signals.

10. An image reject down converter according to claim 4, wherein said image reject down converter is embodied on an integrated circuit.

11. An RF receiver, comprising:

a filter which receives a modulated signal at a first center frequency and generates a filtered signal, the filter having a filter roll-off frequency region in which the attenuation of the filter varies with frequency;

an image reject down converter which receives the filtered signal and outputs a down converted signal having a center frequency substantially lower than the first center frequency of the modulated signal, the down converter defining an image band shifted from the center frequency and being within the roll-off frequency region of the filter, said down converter phase shifting the filtered input signal into first and second intermediate signals phase shifted with respect to each other by 90 degrees, said down converter further including first and second phase shifters each phase shifting a respective one of the first and second intermediate signals to generate first and second phase shifted signals, the first and second phase shifters phase shifting the first and second intermediate signals at a center frequency shifted from the center frequency of the down converted signal so that the image reject down converter asymmetrically attenuates the filtered signal in the image band in a manner substantially opposite the attenuation of the modulated signal by the filter so that the attenuation of the down converted signal in the image band is at least substantially symmetric and greater than the attenuation of the modulated signal by the filter in the image band.

12. An RF receiver according to claim 11, further including a demodulator coupled to the image reject down converter and which demodulates the down converted signal.

13. An RF receiver according to claim 12, wherein said image reject down converter is embodied on an integrated circuit.

14. A method of down converting a signal, which signal is asymmetrically attenuated in a first frequency region, to generate a down converted signal, said method comprising:

receiving the signal;

phase shifting the received signal to generate first and second intermediate signals phase shifted with respect to each other by 90 degrees;

phase shifting the first and second intermediate signals to generate first and second phase shifted signals; and combining the first and second phase shifted signals to generate the down-converted equal to at least one of (i) the sum and (ii) the difference of the first and second phase shifted signals, the down converted signal having a center frequency and an image band spaced from the center frequency and situated in the first frequency region, said phase shifting of the first and second intermediate signals being at a frequency different from the center frequency of the down converted signal to asymmetrically attenuate the received signal in the image band in a manner substantially opposite the attenuation of the modulated signal so that the attenuation of the down converted signal in the image band is at least substantially symmetric.

15. The method as recited in claim 14, wherein the first phase-shifted signal is about forty five (45) degrees out of phase with respect to the first intermediate signal and the second phase-shifted signal is about one hundred thirty five (135) degrees out of phase with respect to the second intermediate signal.

\* \* \* \* \*